United States Patent
Bruchhaus et al.

(10) Patent No.: US 7,183,121 B2
(45) Date of Patent: Feb. 27, 2007

(54) PROCESS FOR FABRICATION OF A FERROCAPACITOR

(75) Inventors: Rainer Bruchhaus, Munich (DE); Karl Hornik, Kanagawa-ken (JP)

(73) Assignee: Infineon Technologies AG, Munich ( * ) Notice: Subject to any disclaimer, the term of this patent is extended or adjusted under 35 U.S.C. 154(b) by 49 days.

(21) Appl. No.: 10/673,053

(22) Filed: Sep. 26, 2003

(65) Prior Publication Data
US 2005/0067642 A1    Mar. 31, 2005

(51) Int. Cl.
*H01L 21/00* (2006.01)
(52) U.S. Cl. .................... 438/3; 257/295; 438/48; 438/785
(58) Field of Classification Search ............ 438/3, 438/240, 486, 2
See application file for complete search history.

(56) References Cited

U.S. PATENT DOCUMENTS

| 5,155,573 | A | 10/1992 | Abe et al. |
| 5,745,336 | A | 4/1998 | Saito et al. |
| 6,384,440 | B1 * | 5/2002 | Mori et al. ............... 257/296 |
| 2001/0007366 | A1 | 7/2001 | Kim et al. |
| 2002/0163058 | A1 | 11/2002 | Chen et al. |
| 2003/0058700 | A1 | 3/2003 | Bruchhaus et al. |
| 2003/0175487 | A1 | 9/2003 | Kita |
| 2004/0084701 | A1 * | 5/2004 | Kanaya et al. ............... 257/295 |

OTHER PUBLICATIONS

Katsuhiro Aoki, et al., "Effects of Titanium Buffer Layer on Lead-Zirconate-Titanate Crystallization Processes in Sol-Gel Deposition Technique", *Jpn. J. Appl. Phys.*, vol. 34, Part 1, No. 2, pp. 192-195, Jan. 1995.
Katsuhiro Aoki, et al., "Ferroelectric Properties of Crystalline-Oriented Lead-Zirconate-Titanates Formed by Sol-Gel Deposition Technique", *Jpn. J. Appl. Phys.*, vol. 34. Part 1, No. 2B. pp. 746-751, Feb. 1995.
P. Muralt, et al., "Texture control of PbTiO$_3$ and Pb(Zr, Ti)O$_3$ thin films with TiO$_2$ seeding", *J. Appl. Physics*, 83(7):3835-3841, Apr. 1998.

* cited by examiner

*Primary Examiner*—Brook Kebede
*Assistant Examiner*—Su C. Kim
(74) *Attorney, Agent, or Firm*—Fish & Richardson P.C.

(57) ABSTRACT

A process for fabricating a ferrocapacitor comprises etching a layer of amorphous PZT formed over a layer having a low concentration of nucleation centres for PZT crystallisation. The etching step forms individual PZT elements. The side surfaces of the PZT elements are then coated with a layer of a material which promotes crystallisation of the PZT, such as one having a high concentration of PZT crystallisation centres (e.g. TiO$_2$), and a PZT annealing step is carried out. The result is that the PZT has a high degree of crystallisation, with grain boundaries extending substantially horizontally through the PZT elements.

6 Claims, 1 Drawing Sheet

PROCESS FOR FABRICATION OF A FERROCAPACITOR

FIELD OF THE INVENTION

The present invention relates to fabrication processes for ferroelectric devices which include one or more ferrocapacitors, and to ferroelectric devices produced by the fabrication processes.

BACKGROUND OF INVENTION

Many conventional FeRAM devices include a horizontal ferrocapacitor structure, in which a stack of layers is formed including top and bottom electrodes sandwiching a ferroelectric layer. An alternative "vertical capacitor" structure was suggested in U.S. Pat. No. 6,300,652, the disclosure of which is incorporated herein by reference. A vertical capacitor includes a ferroelectric element sandwiched between electrodes to either side, all at substantially the same level in the FeRAM device.

The vertical capacitors are typically to be formed over a substructure. The substructure includes various electronic components buried in a matrix (e.g. of TEOS (tetraethylorthosilicate)). The substructure further includes conductive plugs connected to the electronic components, and which extend upwards through the matrix. The upper ends of the plugs terminate in TiN/Ir barrier elements, having a top surface flush with the surface of the matrix.

Conventionally, an insulating layer of $Al_2O_3$ is formed over the surface of the matrix, and a thicker layer of ferroelectric material such as PZT ($PbZrTiO_3$) is formed over that, and then crystallised in an oxygen atmosphere. The $Al_2O_3$ layer acts as a seed layer for PZT crystallisation, and has the further function of inhibiting oxygen diffusion into the substructure during the PZT crystallisation.

Hardmask elements are then deposited over selected areas of the PZT layer, and the portions of the PZT and $Al_2O_3$ which are not protected by the hardmask elements are etched all the way through, forming openings.

The openings are then filled with conductive material such as $IrO_2$, by depositing $IrO_2$ over the entire structure and chemical-mechanical planarization (CMP) polishing is performed to form a flat upper surface which is partly the PZT and partly the conductive material. Then, an $Al_2O_3$ layer is formed over the surface. The elements of $IrO_2$ constitute electrodes, while the remaining PZT elements constitute the dielectric elements of the ferrocapacitors. At least some of the electrodes may be in electrical contact with the plugs, via the barrier elements.

The vertical capacitor structure has great potential for reducing the cell size, especially if the angle between the horizontal direction and the sides of the remaining PZT elements is high.

SUMMARY OF THE INVENTION

The present inventors have realized that the crystallisation step of the conventional method described above has the disadvantage that crystal boundaries in the PZT (which are generally parallel to the crystallisation direction) tend to be vertical, which also implies that they are orthogonal to the electric field direction when the ferrocapacitors are in use. The grain boundaries and their surrounding regions have different electrical properties compared to the bulk of the PZT grain. Therefore the grain boundaries, which intercept all the electric field lines, may interfere with the operation of the device.

The present invention aims to provide a new and useful process for fabricating ferrocapactitors, and to provide devices including such ferrocapacitors.

In general terms, the present invention proposes that the crystallisation of the PZT (or other ferroelectric material) should be performed after the etching of the PZT, and that before the crystallisation step the sides of the PZT elements should be coated with a material which promotes crystallisation (e.g. by having more nucleation sites) to a greater degree than the material directly below the PZT (and any material directly above the PZT at the time of the crystallisation).

Thus, the crystallisation of the PZT proceeds from the side walls. Thus, the crystal boundaries in the PZT tend to be horizontal, i.e parallel to the electric field direction in the device, thus improving the performance and consistency of the ferrocapacitors.

The material on the sides of the PZT elements may be $TiO_2$. Conveniently, the $TiO_2$ film can be formed by depositing Ti on at least the sides of the etched PZT, the Ti being oxidised by contact with the PZT.

The material below (and optionally above) the PZT at the time of the crystallisation may an electrically insulating inorganic oxide, and in particular may be selected from the group consisting of $Al_2O_3$, $Ta_2O_5$, $CeO_2$, $Y_2O_3$, $ZrO_2$, and $HfO_2$. The first two members of this group are preferred.

Specifically, one embodiment of the invention is a method of forming a ferroelectric capacitor comprising forming a crystalline PZT layer by a process including the steps of:

depositing a layer of amorphous ferroelectric material over a layer of a first material;

etching the ferroelectric layer to form isolated ferroelectric elements;

providing a layer of a second material on at least the side surfaces of the ferroelectric elements; and performing an annealing step to crystallize the ferroelectric material;

the second material promoting crystallisation of the ferroelectric material to a higher degree than the first material, whereby the crystallisation proceeds horizontally through the ferroelectric elements.

Another embodiment of the invention is method of forming a vertical ferromagnetic capacitor comprising forming a crystalline ferroelectric layer by a process including the steps of:

depositing a ferroelectric layer of amorphous ferroelectric material directly on a layer of a first electrically insulating material;

depositing a layer of a second electrically insulating material to cover the ferroelectric layer;

etching the ferroelectric layer and the layer of the second electrically insulating material to form isolated ferroelectric elements which have exposed side surfaces;

providing a layer of a conductive material in contact with each of the side surfaces; and performing an annealing step to crystallize the ferroelectric material;

the conductive material promoting crystallization of the ferroelectric material to a higher degree than the first and second electrically insulating materials, whereby the crystallization proceeds substantially horizontally through each of the ferroelectric elements.

BRIEF DESCRIPTION OF THE FIGURES

Preferred features of the invention will now be described, for the sake of illustration only, with reference to the following figures in which.

DETAILED DESCRIPTION OF THE EMBODIMENTS

Figure 1A:
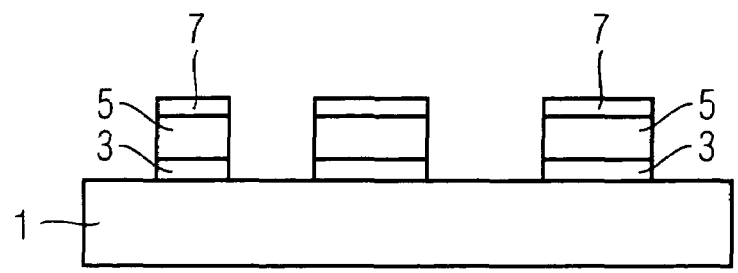
FIG. 1, which is composed of FIGS. 1(a) to 1(c), shows a process for fabricating a crystalline PZT layer in a ferroelectric capacitor formation process which is an embodiment of the invention.

Referring firstly to FIG. 1(a), a structure is shown which is formed during a ferroelectric capacitor fabrication process which is an embodiment of the invention. A substrate 1 is shown which may be TEOS. This substrate may correspond exactly to the substructure of conventional devices discussed above. Below the substrate 1 may be located electronic components, and electrically conductive plugs (not shown) may extend upward through the substrate 1, e.g. terminating at in TiN/Ir barrier elements.

On the TEOS layer 1 are elements 3 of a chemically inert and electrically insulating bottom isolation layer (e.g. $Al_2O_3$ or $Ta_2O_5$). Over the elements 3 are ferroelectric elements 5 of PZT and further elements 7 of the same chemically inert material which forms layer 3. The PZT elements 5 and elements 3, 7 were formed from respective layers of amorphous PZT and the non-conductive matter (e.g. $Al_2O_3$) which were formed over the TEOS layer 1 (e.g. by sputtering, at least in the case of the PZT), and then etched (using masking elements, e.g. of TEOS which are not shown). Dry etching is the preferred etching technique here, to guarantee a well shaped structure with a high taper angle.

Figure 1B:
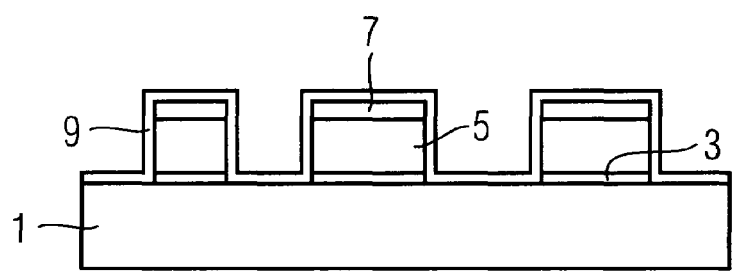

As shown in FIG. 1(b), a Ti layer 9 is deposited over the structure of FIG. 1(a), preferably to a thickness of no more than 5 nm.

The Ti is rapidly turned to $TiO_2$ during this deposition process by reaction with the PZT. The $TiO_2$ covers the two sides of the PZT elements 5.

Figure 1C:
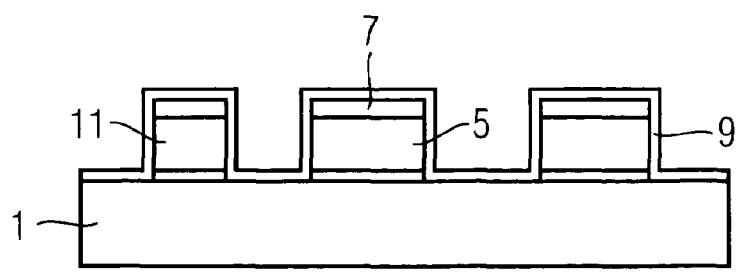

The structure is then annealed. This may be carried out for example at a temperature in the range 500° C. to 700° C. in an oxygen atmosphere for a period which may be in the range of a few seconds to a few minutes. The $TiO_2$ layer 9 provides a high number of nucleation sites, so that the crystallisation proceeds from both of its interfaces with the PZT, resulting in crystal boundaries in the PZT elements 5 which are substantially horizontal (a term which may, for example, be defined to mean that the normal to the boundaries is, averaged over them, less than 20 degrees, or less than 10 degrees, from the normal to the upper surface of the substrate 1). As shown in FIG. 1(c), the PZT layer 5 is crystallised in this process to a form crystalline ferroelectric element 11.

The process of promoting crystallisation of $PbTiO_3$ and PZT films is described for example in "Texture control of $PbTiO_3$ and $Pb(Zr,Ti)O_3$ thin films with $TiO_2$ seeding", by P. Muralt et al, in Journal of Applied Physics, Volume 83, No. 7, p3835–3841, 1 Apr. 1998, the disclosure of which is incorporated here by reference.

Thus, the invention makes it possible for crystalline PZT elements 11 to be formed with a high degree of crystallinity, and with crystal barriers which are substantially horizontal (i.e. substantially parallel to the upper surface of the substrate 1), which also implies that they are substantially parallel to the electric field direction when the ferrocapacitor is in use.

Further steps of the fabrication technique may be as described above in relation to the prior art method. In particular, the next step may be to fill in the gaps between the PZT elements with conductive material, such as $IrO_2$, and then to planarize the top surface of the $IrO_2$ by a CMP planarization step. During this step, the $TiO_2$ overlying the elements 7 may be removed, but preferably some or all of the upper element 7 is retained, since it provides a useful encapsulation material during metallization steps (known from the prior art) which are used to provide external circuitry of the memory device.

Note that $TiO_2$ is usually an insulator if it is a ell-crystallized material with proper stoichiometry. Therefore the thickness of the layer $TiO_2$ should be selected appropriately, taking into account that part of the Ti may be sucked into the PZT and incorporated into the lattice during the PZT crystallization process. Note that in FIG. 1 there is a layer of $TiO_2$ covering the upper surface of the TEOS 1 between the elements 3, and some of these areas may include the top surfaces of the plugs extending through the TEOS 1 (or, more usually, the top surfaces of diffusion barriers over the plugs), so if the $TiO_2$ layer 9 is not removed before the conductive material (such as $IrO_2$) is inserted between the elements 3 then the layer 9 should be thin enough not to electrically insulate the plug and the corresponding $IrO_2$ element(s). Alternatively, before the gaps are filled with $IrO_2$, an etching sep can be performed during which $TiO_2$ 9 is removed from the TEOS layer 1 as well as from the top of the elements 7. A side effect of this might be that during the etching some of the $TiO_2$ (if any remains) might be removed from the side walls of the PZT elements 5.

One variation of the method of the method described above within the scope of the present invention would be that, instead of, as described above, etching the $Al_2O_3$ (or $Ta_2O_5$) layer overlying the TEOS 1 to form the elements 3 during the same etching process which forms the elements 5, 7 from their respective layers, the $Al_2O_3$ (or $Ta_2O_5$) layer overlying the TEOS 1 may be etched following the crystallisation of the PZT elements 9 and before the $IrO_2$ is applied between the PZT elements 9. An advantage of this is that the $Al_2O_3$ layer overlying the TEOS 1 can provide an effective oxygen barrier layer until it is etched. Thus, the diffusion barrier elements covering the plug do not have to withstand oxygen diffusion to the plug during the thermal heating which causes the PZT crystallisation.

What is claimed is:

1. A method of forming a ferroelectric layer for a vertical ferromagnetic capacitor comprising forming a crystalline ferroelectric layer by a process including the steps of:

depositing a ferroelectric layer of amorphous ferroelectric material directly on a layer of a first electrically insulating material;

depositing a layer of a second electrically insulating material to cover the ferroelectric layer;

etching the ferroelectric layer and the layer of the second electrically insulating material to form isolated ferroelectric elements which have exposed side surfaces that are substantially perpendicular to the ferroelectric layer;

providing a layer of a third material in contact with each of the side surfaces; and performing an annealing step to crystallize the ferroelectric material;

the third material promoting crystallization of the ferroelectric material to a higher degree than the first and second electrically insulating materials, whereby the crystallization proceeds substantially horizontally through each of the ferroelectric elements.

2. A method according to claim 1 in which the third material is $TiO_2$.

3. A method according to claim 2 in which the $TiO_2$ is formed by depositing Ti on at least the side surfaces of the ferroelectric elements, and oxidizing the Ti to form $TiO_2$.

4. A method according to claim 3 in which the Ti is oxidized to $TiO_2$ by chemical reaction with the ferroelectric material.

5. A method according to claim 1 further including depositing electrode elements of conductive material between the ferroelectric elements.

6. A method according to claim 1 in which the ferroelectric material is PZT.

* * * * *